(12) United States Patent
Park et al.

(10) Patent No.: US 6,395,637 B1
(45) Date of Patent: *May 28, 2002

(54) METHOD FOR FABRICATING A INDUCTOR OF LOW PARASITIC RESISTANCE AND CAPACITANCE

(75) Inventors: Min Park; Cheon Soo Kim; Hyun Kyu Yu, all of Daejeon (KR)

(73) Assignee: Electronics and Telecommunications Research Institute, Daejeon (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/168,343

(22) Filed: Oct. 7, 1998

(30) Foreign Application Priority Data

Dec. 3, 1997 (KR) .............................. 97-65704

(51) Int. Cl.$^7$ ............................................. H01L 21/302
(52) U.S. Cl. ..................... 438/706; 438/720; 438/723; 438/724
(58) Field of Search ................... 438/706, 720, 438/745, 754, 723, 724

(56) References Cited

U.S. PATENT DOCUMENTS

| | | | | |
|---|---|---|---|---|
| 5,095,357 A | * | 3/1992 | Andoh et al. | 357/51 |
| 5,336,921 A | * | 8/1994 | Sundaram et al. | 257/531 |
| 5,481,131 A | * | 1/1996 | Staudinger et al. | 257/531 |
| 5,497,337 A | * | 3/1996 | Ponnapalli et al. | 364/489 |
| 5,539,241 A | * | 7/1996 | Abidi et al. | 257/531 |
| 5,604,383 A | * | 2/1997 | Matsuzaki | 257/778 |
| 5,874,883 A | * | 2/1999 | Uemura et al. | 336/200 |
| 6,002,161 A | * | 12/1999 | Yamazaki | 257/531 |

FOREIGN PATENT DOCUMENTS

JP 5-62836 * 3/1993

OTHER PUBLICATIONS

J.N. Burghartz et al., "Monolithic Spiral Inductors Fabricated Using a VLSI Cu–Damascene Interconnect Technology and Low–Loss Substrates", 1996 IEEE, pp. IEDM96–99–102.*

Seung Won Paek et al., "Air–Gap Stacked Spiral Inductor", 1997 IEEE, pp. 329–331.*

Bon–Kee Kim et al., "Monolithic Planar RF Inductor and Waveguide Structures on Silicon with performance Comparable to those in GaAs MMIC", 1995 IEEE, pp. IEDM95–717–720.*

J.Y.C. Chang et al., "Large Suspended Inductors on Silicon and Their Use in a 2–μm CMOS RF Amplifier", 1993 IEEE, pp. 246–248.

* cited by examiner

Primary Examiner—Robert Kunemund
Assistant Examiner—Charlotte A. Brown
(74) Attorney, Agent, or Firm—Jacobson Holman, PLLC

(57) ABSTRACT

The present invention relates to a method for fabricating an inductor and, more particularly, to a method for fabricating a spiral inductor used in a monolithic microwave integrated circuit on a silicon substrate using semiconductor fabrication processes. The method for fabricating an inductor, comprising the steps of: forming a first dielectric layer on a silicon substrate and forming a first metal wire on the first dielectric layer, wherein the first metal wire is in contact with an active element formed on the silicon substrate; and alternatively forming dielectric layers and metal layers, wherein the metal layers are electrically connected with an upper metal wire and a lower metal wire and wherein the metal layers are patterned using the dielectric layers as etching mask, whereby a metal corrosion is prevented by using the spiral dielectric pattern as the etching mask.

14 Claims, 17 Drawing Sheets

METHOD FOR FABRICATING A INDUCTOR OF LOW PARASITIC RESISTANCE AND CAPACITANCE

BACKGROUND OF THE INVENTION

1. Field of the Invention

The present invention relates to a method for fabricating an inductor and, more particularly, to a method for fabricating a spiral inductor used in a monolithic microwave integrated circuit on a silicon substrate using semiconductor fabrication processes.

2. Description of the Related Arts

Passive elements, such as spiral inductors and capacitors, have been formed in an integrated circuit on GaAs and Si substrate. However, the most important factor of the spiral inductor, quality factor Q, deteriorates by means of undesired characteristics such as parasitic resistance and capacitance, and the self resonant frequency (fwo) becomes lower. Accordingly, it is very difficult to directly apply them to a high frequency integrated circuit. To overcome these characteristic problems, a low-resistance metal line, such as a Au layer, has been used for reducing the parasitic resistance and a thick metal wire has been used for reducing the parasitic capacitance. Further, an improvement of the passive elements has been achieved by making the thickness of a dielectric layer thick, reducing the parasitic capacitance.

However, considering that the aluminum layer is more used than the gold layer in the CMOS processes, it is very difficult to make a high performance spiral inductor using a dry etching pattern process in case where a metal wire is formed to a thickness of approximately over 1 $\mu$m to reduce the resistance and a photoresist layer is used as an etching mask in the photolithograpy processes.

Although a great deal of labor has been made in order to implement an inductor on a silicon substrate, using the semiconductor integrated circuit processing techniques, it is difficult to manufacture a high performance spiral inductor because of the loss of electromagnetic wave and the parasitic component. Also, since resistance of a metal wire, which is used in a coil of the inductor, considerably has influence on inductor's feature, a recently advanced study makes an attempt to reduce the resistance, by providing three-layer or four-layer metal wire with the inductor coil. However, this multi-layer structure needs complicated processes and very expensive fabrication cost. The selection of the low resistance metal wire for lowering resistance of the inductor is restricted within narrow limits in that it should be formed on the silicon substrate.

Referring now to FIGS. 1A and 1B, a first dielectric layer 2 is formed on a silicon substrate 1 and a first metal wire 3 having a predetermined width is formed on the first dielectric layer 2. A second dielectric layer 4, which has a via hole 5 to expose a portion of the first metal wire 3, is formed on the resulting structure and then an upper layer (inductor) formed on the second dielectric layer 4 is electrically connected to the first metal wire 3 through the via hole 5. A second metal wire 7 as a spiral inductor is formed on the second dielectric layer 4, being in contact with the first metal wire 3. Further, a passivation layer 9 is formed on the second dielectric layer 4 and the second metal wire 7. As shown in FIG. 1B, the first metal wire 3 is electrically connected to the second metal wire 7 through the via hole 5 and the second metal wire 7 has a spiral shape with center in the via hole 5.

As illustrated in FIGS. 1A and 1B, in the conventional inductor forming the second metal wire in the silicon substrate, the inductor pattern of the second metal wire is formed by the dry etching process using a photoresist layer as an etching mask. Accordingly, since the selective etching ratio of the second metal wire to the photoresist layer is low, it is restricted to increase the thickness of the second metal wire. Also, three or four metal wires can be employed to reduce resistance of the inductor, but this multilayer structure is very expensive and requires complicated processes. Further, the DI (deionized water) clearing process is required to eliminate corrosion of the metal wire which is caused by the reaction in which chlorine generated in dry etching of the metal wire reacts on the photoresist layer with the complication of the fabricating processes.

Also, in fabricating the conventional spiral inductor, although air bridge process has been used when the second metal wire of the inductor coil intersects the first metal wire or Au layer has been used for reducing resistance of the metal wire, these methods cannot be easily applied to the monolithic microwave integrated circuit on the silicon substrate.

SUMMARY OF THE INVENTION

An object of the present invention is to provide a method for fabricating a spiral inductor which is applied to the monolithic microwave integrated circuit on the silicon with facility.

Another object of the present invention is to provide a method for fabricating a spiral inductor having low resistance, high quality factor Q and high self resonant frequency.

In accordance with an aspect of the present invention, there is provided a method for fabricating an inductor, comprising the steps of: forming a first dielectric layer on a silicon substrate and forming a first metal wire on the first dielectric layer, wherein the first metal wire is in contact with an active element formed on the silicon substrate; forming a second dielectric layer on the resulting structure and forming an opening exposing the first metal wire; forming a second metal wire which is electrically connected with the first metal wire; forming a spiral dielectric pattern on the second metal wire; and etching the second metal wire using the spiral dielectric pattern as an etching mask, thereby forming a spiral metal wire.

In accordance with another aspect of the present invention, there is provided a method for fabricating an inductor, comprising the steps of: forming a first dielectric layer on a silicon substrate and forming a first metal wire on the first dielectric layer, wherein the first metal wire is in contact with an active element formed on the silicon substrate; forming a second dielectric layer on the resulting structure and forming a first opening and recesses exposing the first metal wire; forming a second metal wire which is electrically connected with the first metal wire; forming a first spiral dielectric pattern on the second metal wire; etching the second metal wire using the first spiral dielectric pattern as an etching mask, thereby forming a first spiral metal wire; forming a third dielectric layer on the resulting structure and patterning the third dielectric layer to expose the second metal wire through a second opening and recesses; and forming a third metal wire which is electrically connected with the second metal wire; forming a second spiral dielectric pattern on the third metal wire; and etching the third metal wire using the second spiral dielectric pattern as an etching mask, thereby forming a second spiral metal wire.

In accordance with further another aspect of the present invention, there is provided a method for fabricating an inductor, comprising the steps of: forming a first dielectric layer on a silicon substrate and forming a first metal wire on the first dielectric layer, wherein the first metal wire is in contact with an active element formed on the silicon substrate; forming a second dielectric layer on the resulting structure and forming an opening exposing the first metal wire; forming a second metal wire which is electrically connected with the first metal wire; forming a first spiral dielectric pattern on the second metal wire; etching the second metal wire using the first spiral dielectric pattern as an etching mask, thereby forming a first spiral metal wire; forming a third dielectric layer on the resulting structure and patterning the third dielectric layer to expose the second metal wire through an opening; forming a third metal wire which is electrically connected with the second metal wire; forming a second spiral dielectric pattern on the third metal wire; and etching the third metal wire using the second spiral dielectric pattern as an etching mask, thereby forming a second spiral metal wire.

In accordance with still further another aspect of the present invention, there is provided a method for fabricating an inductor, comprising the steps of: forming a first dielectric layer on a silicon substrate and forming a first metal wire on the first dielectric layer, wherein the first metal wire is in contact with an active element formed on the silicon substrate; and alternatively forming dielectric layers and metal layers, wherein the metal layers are electrically connected with an upper metal wire and a lower metal wire and wherein the metal layers are patterned using the dielectric layers as etching mask.

BRIEF DESCRIPTION OF THE DRAWINGS

A further understanding of the nature and advantage of the present invention will become apparent by reference to the remaining portions of the specification and drawings, in which.

DETAILED DESCRIPTION OF THE PREFERRED EMBODIMENT

A detailed description of embodiments according to the present invention will be given below with reference to accompanying drawings.

In order to reduce the parasitic resistance generated in the common spiral inductor which is used in the monolithic microwave integrated circuit, after depositing a thick metal wire for an inductor coil metal wire the present invention forms a dielectric hard mask, such as a silicon oxide layer and/or a silicon nitride layer, on the thick metal wire so that the thick inductor coil pattern is formed.

Figure 2A:
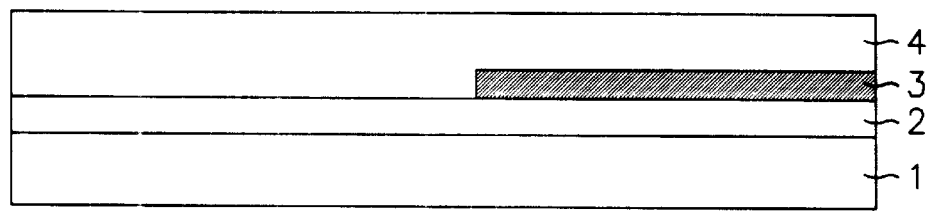
FIGS. 2A, 2B, 2C, 2D, 2E and 2F are cross-sectional views illustrating a method for fabricating a spiral inductor according to a first embodiment of the present invention.

FIGS. 2A to 2F are cross-sectional views illustrating a method for fabricating a spiral inductor according to a first embodiment of the present invention;

First, referring to FIG. 2A, after forming CMOS active elements on a high resistive silicon substrate 1 of 100 to 2000 ohm·cm, a first dielectric layer 2 such as a TEOS (tetraethylorthosilicate)/BPSG (borophosphosilicate glass) is formed on the resulting structure so as to isolate the CMOS passive elements from an upper element. A contact hole (not shown) is formed to define the contact area of the CMOS active elements and a first metal wire 3 is formed on the first dielectric layer 2 with a predetermined width. A second dielectric layer 4, such as a $SiO_2$/SOG(spin-on-glass)/$SiO_2$ structure, is formed on the resulting structure.

Figure 2B:
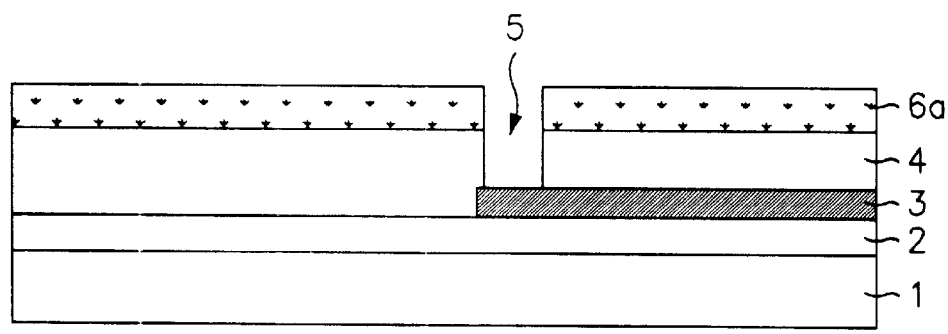

Referring to FIG. 2B, after forming a photoresist layer on the second dielectric layer 4, a first photoresist pattern 6a is formed for exposing a portion of the first metal wire 3. A via hole 5 is formed by etching the second dielectric layer 4 using the first photoresist pattern 6a as an etching mask, thereby exposing an end of the first metal wire 3.

Figure 2C:
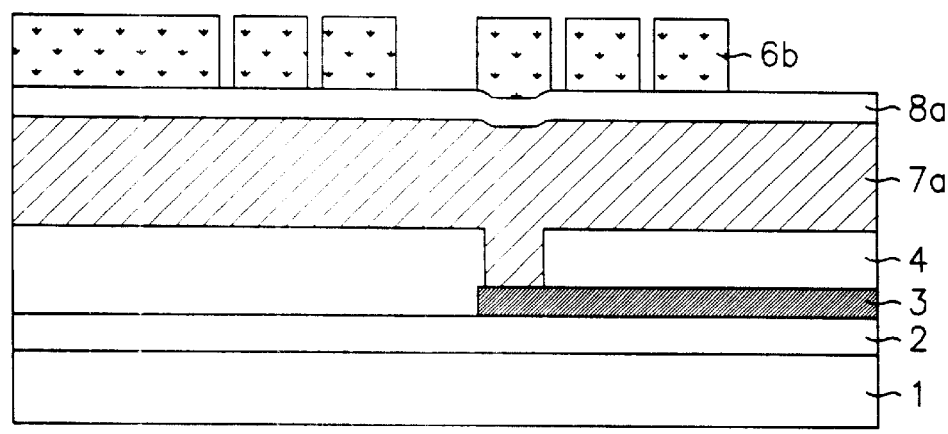

Referring to FIG. 2C, after removing the remaining photoresist pattern 6a, a metal layer 7a is deposited on the resulting structure to a thickness of approximately 2 to 5 $\mu$m and a third dielectric layer 8a such as a silicon oxide layer, a silicon nitride layer or a silicon oxide/silicon nitride layer, is formed on the metal layer 7a. After forming a photoresist layer on the third dielectric layer 8a, a second photoresist pattern 6b is formed by the photolithography process.

At the time of forming the metal layer 7a, a barrier metal wire and an aluminum layer are used. That is, after forming the TiN barrier metal wire, the via hole 5 may be filled with the aluminum layer with the reflowing process thereof. Accordingly, the uniform thickness of the aluminum layer and a planarization of the upper structure as well as the full filling in the via hole are satisfied with this reflowing process. To reduce resistance of the spiral inductor in forming the metal layer 7a, it has thick thickness of more than, at least, 1 $\mu$m. Also, the thickness of the third dielectric layer 8a to form the hard mask should be adjusted to the thickness of the metal layer 7a to be dry-etched according to various processing conditions, the remaining dielectric layer 8a after etching the metal layer 7a may be used as an interlayer insulating layer between the metal wires.

Figure 2D:
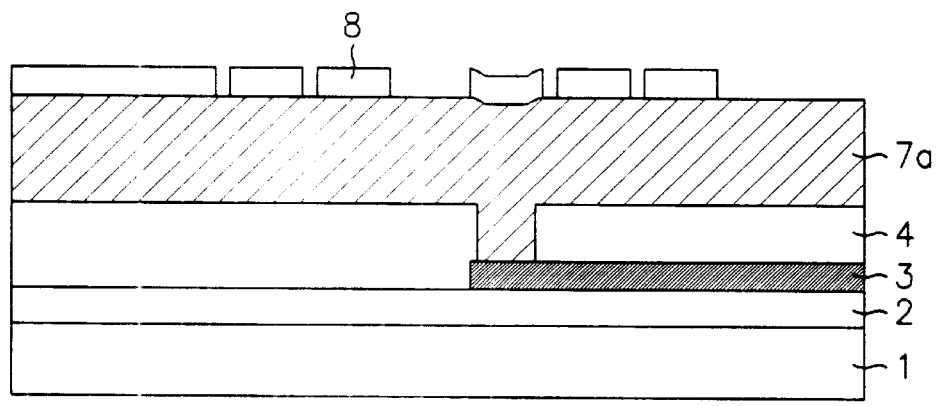

Referring to FIG. 2D, the exposed dielectric layer 8a is dry etched using the second photoresist pattern 6b as an etching mask, thereby forming a dielectric pattern 8, which has a spiral pattern, on the metal layer 7a.

Figure 2E:
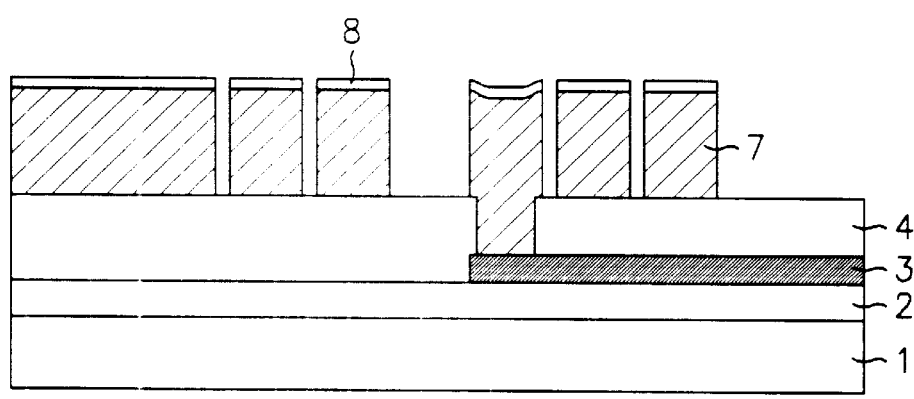
Figure 2F:
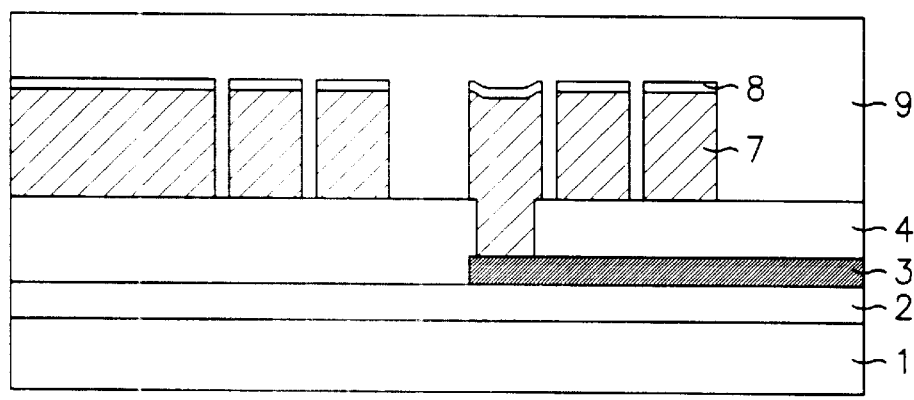

Referring to FIG. 2E, after removing the second photoresist pattern 6b, the metal layer 7a is dry etched using the dielectric pattern 8, having the spiral shape. At this time, the metal layer 7a as an inductor coil is formed, being in contact with the first metal wire 3 through the via hole 5. When the metal layer 7a is etched, it should be noted that the selective etching ratio is of over 10:1 for the metal layer 7a to the dielectric pattern 8. Accordingly, although the metal layer 7a is deposited to a thickness of over 1 $\mu$m, the dielectric pattern 8 may act as an etching mask and the thickness of the dielectric pattern 8 used as an etching mask 8 may be adjusted to that of the metal layer 7a.

Therefore, in case where the photoresist layer is used as an etching mask for patterning a second metal wire 7, the corrosion of the metal wire may be caused by the reaction in which chlorine generated in dry etching the metal wire reacts on the photoresist layer. However, in the present invention, since the dielectric material of the low selective rate to the second metal wire 7 is used, the metal layer's corrosion is prevented.

Referring to 2F, a passivation layer 9 as a dielectric layer protecting the upper structure is formed on the resulting structure, having completed the spiral inductor fabrication.

Figure 1A:
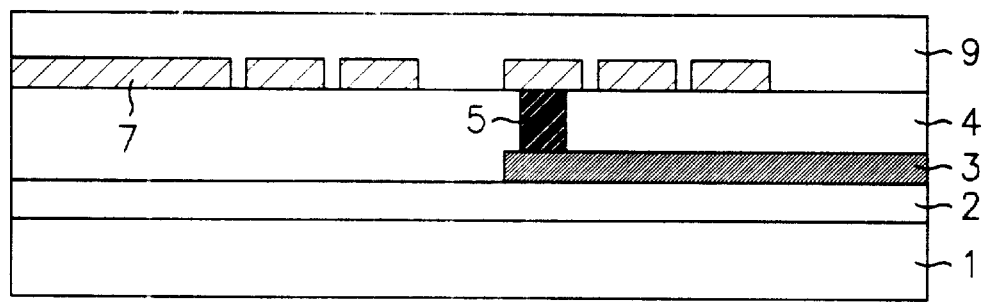
FIG. 1A is a cross-sectional view illustrating a conventional inductor fabricated by CMOS processes.
Figure 1B:
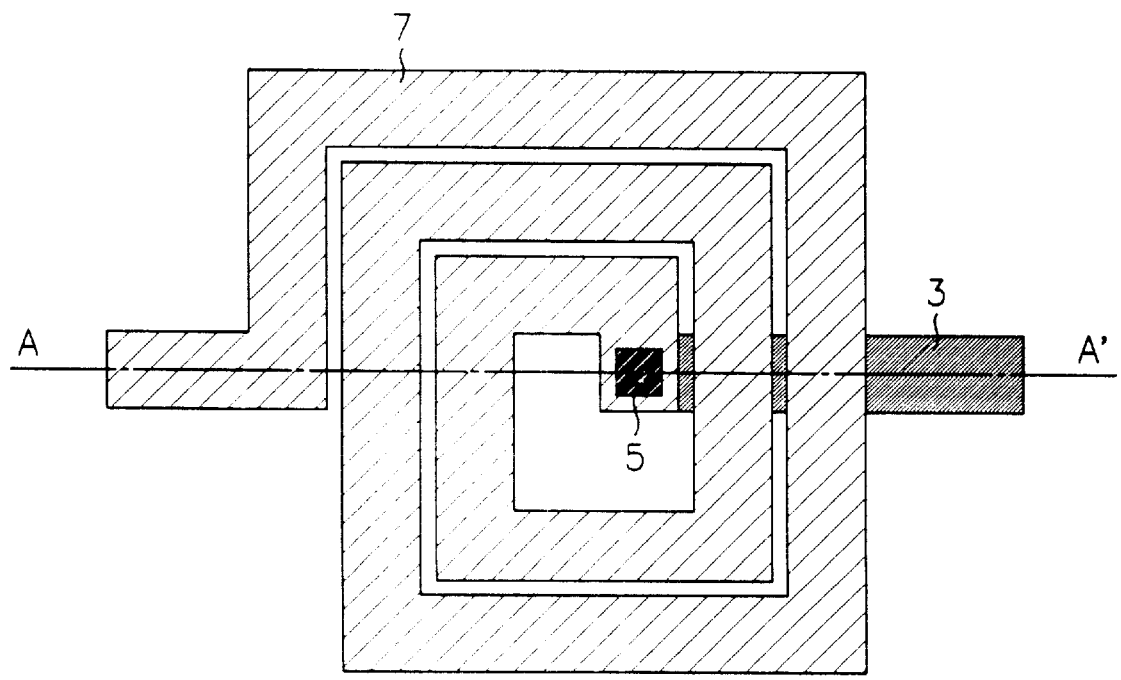
FIG. 1B is a layout of FIG. 1A.
Figure 3A:
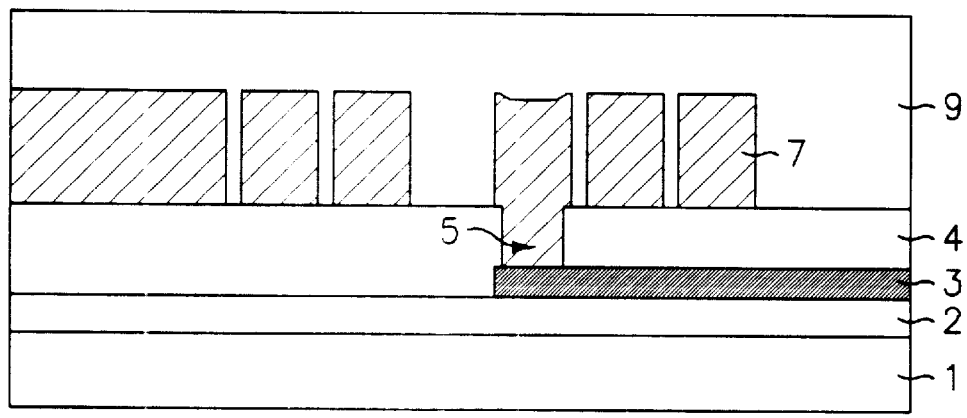
FIG. 3A is a cross-sectional view of the spiral inductor according to the first embodiment of the present invention.
Figure 3B:
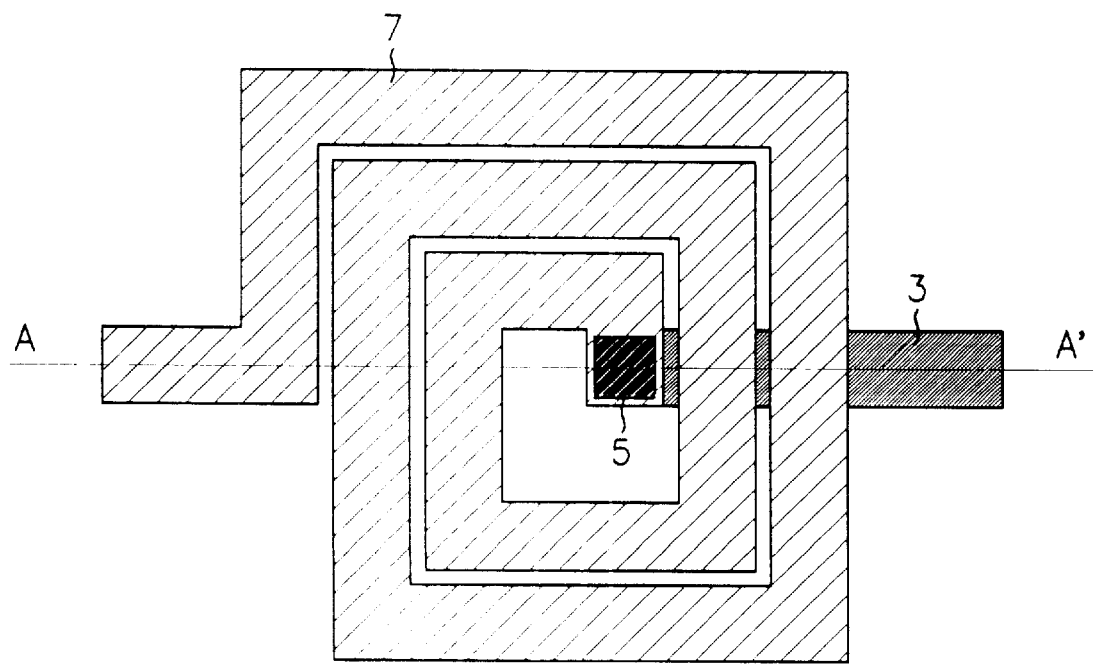
FIG. 3B is a layout of the spiral inductor in FIG. 3A.

As shown in FIGS. 3A and 3B, the inductor shown in the first embodiment has the same shape as shown in FIG. 1, but since the present invention uses the thick dielectric mask pattern instead of the photoresist pattern, it is possible to form the thicker metal wire than the conventional inductor.

FIGS. 4A to 4E are cross-sectional views illustrating a method for fabricating the spiral inductor according to a second embodiment of the present invention, in which the inductor is formed by a three-layer metal wire.

Figure 4A:
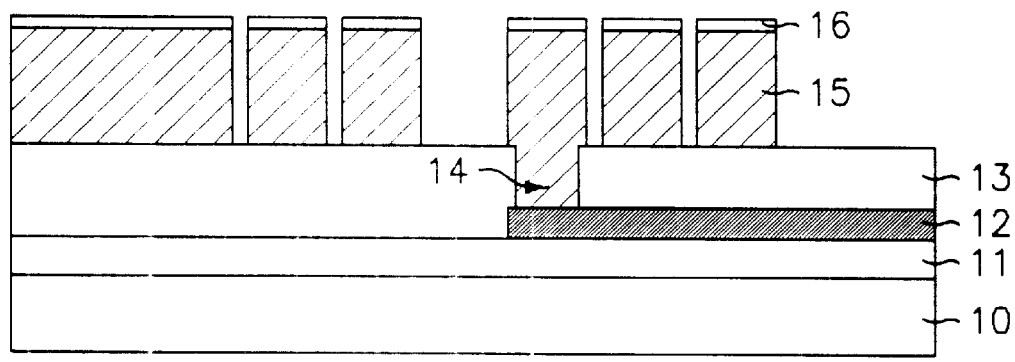
FIGS. 4A, 4B, 4C, 4D and 4E are cross-sectional views illustrating a method for fabricating the spiral inductor according to a second embodiment of the present invention.

Referring to FIG. 4A, after forming CMOS active elements on a silicon substrate 10, a first dielectric layer 11 such as a TEOS/BPSG layer is deposited on the silicon substrate 10. Also, a contact hole (not shown) to define the contact area is formed by patterning the first dielectric layer 11 and a first metal wire 12 is formed on the first dielectric layer 11 with a predetermined width. A second dielectric layer 13, such as a $SiO_2$/SOG(spin-on-glass)/$SiO_2$ structure, is formed on the resulting structure. Thereafter, the second dielectric layer 13 is patterned to expose a portion of the first metal wire 12 through a via hole 14. After forming a second metal wire 15 on the resulting structure, a spiral dielectric pattern 16 as an etching mask is formed on the second metal wire 15. Using the spiral dielectric pattern 16 as an etching mask, the second metal wire 15 is patterned.

Figure 4B:
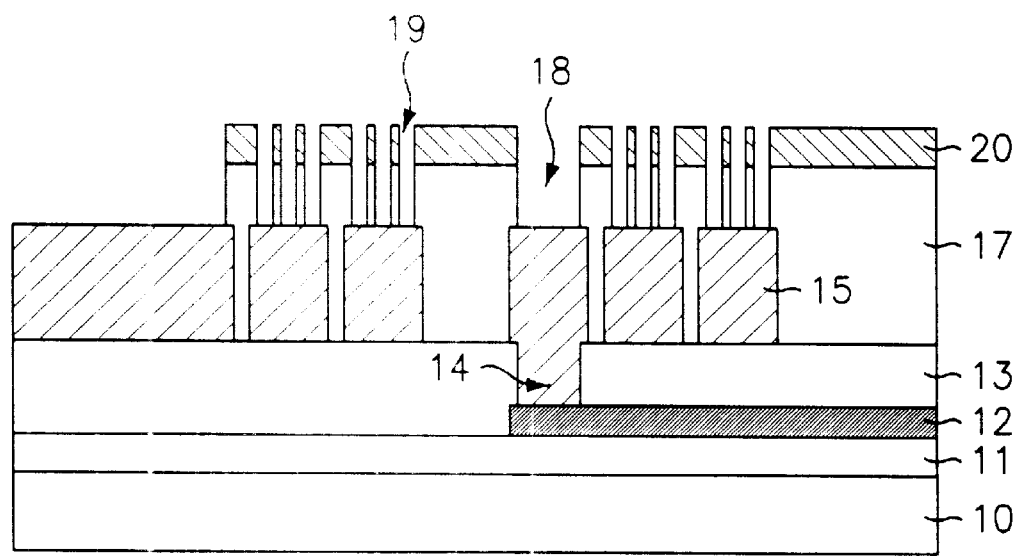

Regarding to FIG. 4B, a third dielectric layer 17, such as a $SiO_2$/SOG/$SiO_2$ structure, is formed on the resulting structure and a photoresist layer is formed on the third dielectric layer 17. A photoresist pattern 20 is formed in order to provide a via hole 18 and a plurality of via recesses 19 which expose the second metal wire 15. Using the photoresist pattern 20 as an etching mask, the third dielectric layer 17 is etched so as to form the via hole 18 and the via recesses 19.

Figure 4C:
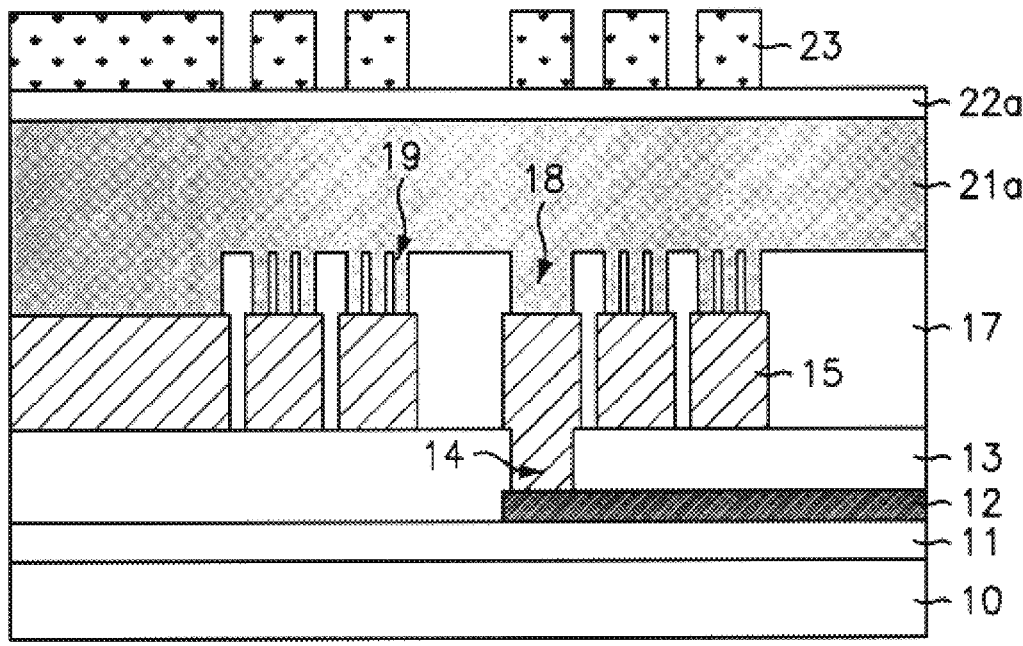

Regarding now to FIG. 4C, the photoresist pattern 20 is removed and a metal layer 21a is formed on the resulting structure. After forming a fourth dielectric layer 22a on the metal layer 21a to provide a hard mask, a spiral photoresist pattern 23 is formed on the fourth dielectric layer 22a, being the same shape as that of the second metal wire 15. Likewise, as the metal layer 21a is formed, a TiN layer is first deposited as a barrier metal and an aluminum (Al) layer thicker than the depth of the via hole is deposited with the reflow process, thereby filling the hole 18 and recesses 19 with the Al layer.

It should be noted that the via hole 18 and the via recesses 19 are fully filed with the Al layer and the uniform thickness of the second metal wire 15 is achieved. Also, the via recesses 19 are formed on the inductor coil of the second metal wire 15 so that it is possible to increase the thickness of the actual inductor coil. In other words, since the via hole 18 and the via recesses 19 are formed on the second metal wire 15, the actual thickness of the inductor coil may be of 3 to 4 $\mu$m even if the second metal wire 15 is approximately 2 $\mu$m. Accordingly, the parasitic resistance generated in the spiral inductor is considerably decreased. A high-performance spiral inductor having a large resonant frequency $f_{wo}$ and a high quality factor Q is achieved.

Figure 4D:
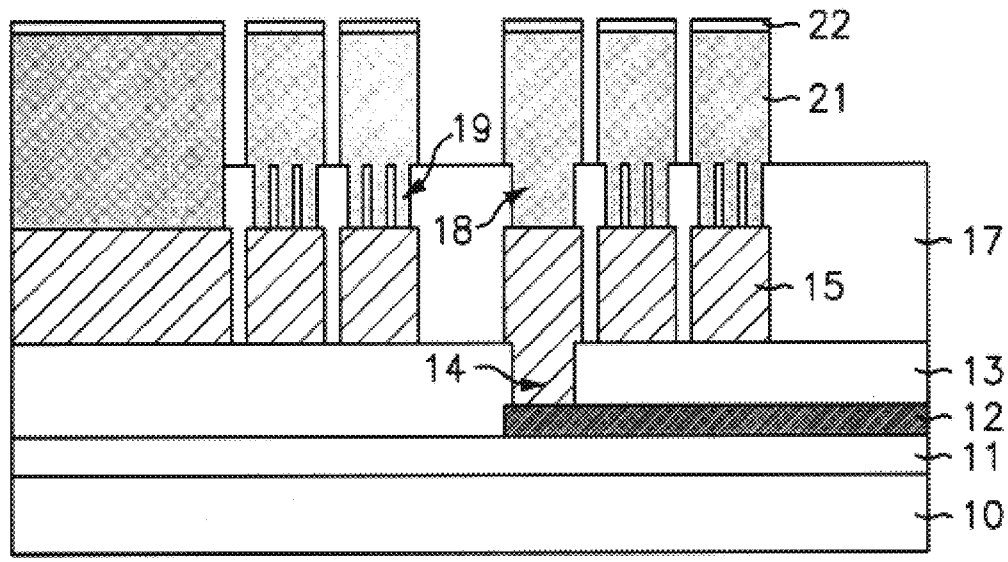

Next, referring now to FIG. 4D, the exposed fourth dielectric layer 22a is etched using the photoresist pattern 23 as an etching mask, after removing the photoresist pattern 23 and the dielectric pattern 22 is used as an etching mask for forming a third metal wire 21.

Figure 4E:
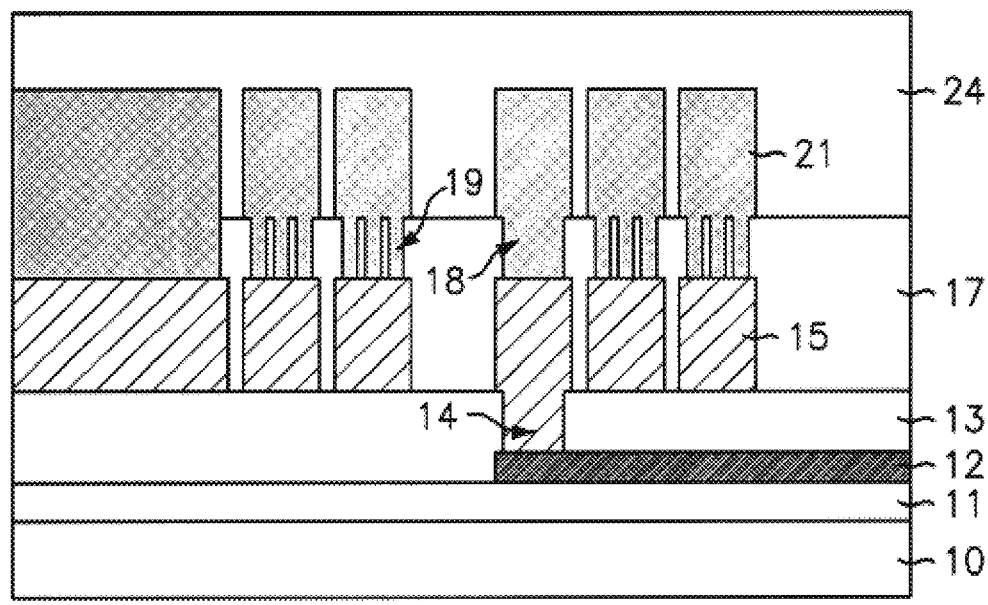

Subsequently, as show in FIG. 4E, the inductor fabricating processes have been completed by forming a passivation layer 24 on the resulting structure.

Figure 5A:
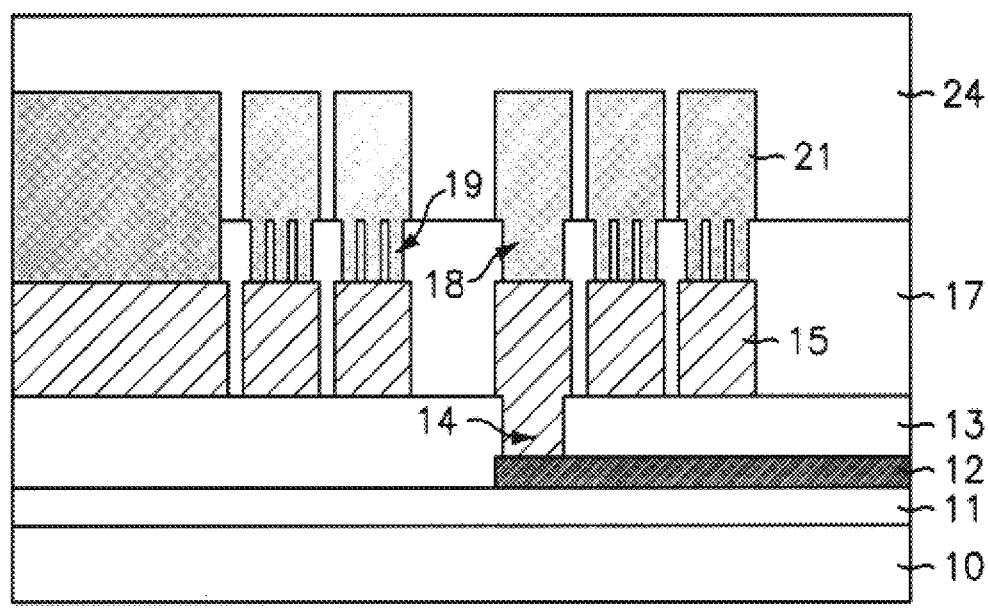
FIG. 5A is a cross-sectional view of the spiral inductor according to the second embodiment of the present invention.
Figure 5B:
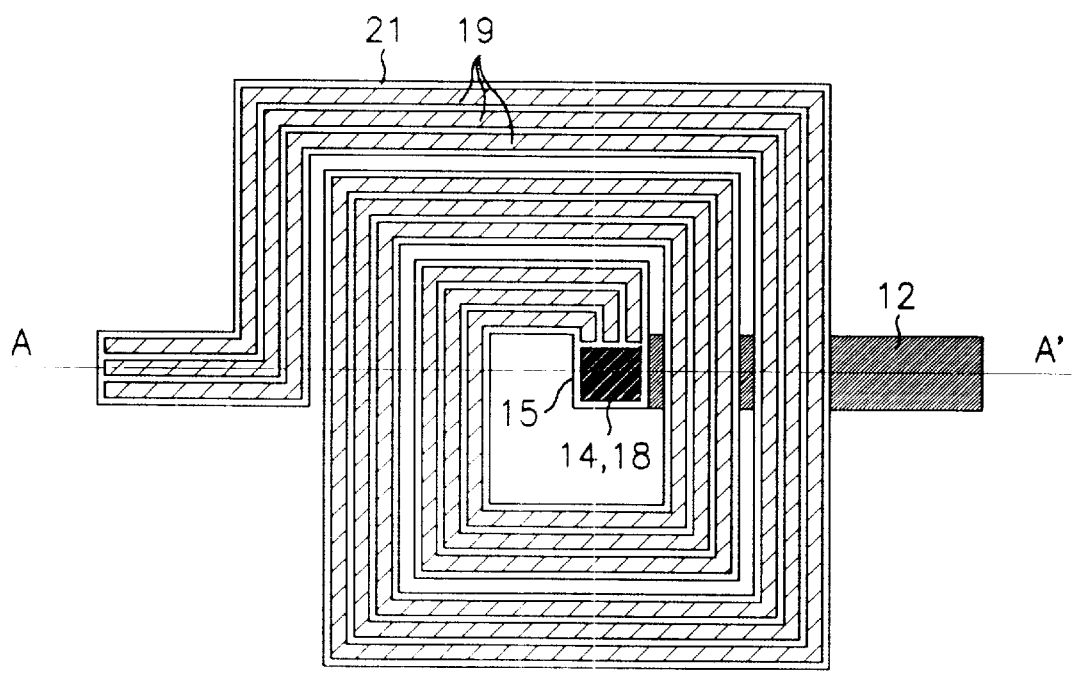
FIG. 5B is a layout of the spiral inductor in FIG. 5A.

FIG. 5A is a cross-sectional view of the spiral inductor according to the second embodiment of the present invention and FIG. 5B is a layout of the spiral inductor in FIG. 5A. Referring to FIGS. 5A and 5B, in the inductor according to the second embodiment of the present invention, the third dielectric layer 17 is formed on the second metal wire 15, the via hole 18 and the via recesses 19, which expose the second metal wire 15, are formed.

FIGS. 6A to 6E are cross-sectional views illustrating a method for fabricating the spiral inductor according to a third embodiment of the present invention. Referring FIG. 6A, after forming CMOS active elements on a silicon substrate 25, a first dielectric layer 26 such as a TEOS/BPSG layer is deposited on the silicon substrate 25. Also, a contact hole (not shown) to define the contact area is formed by patterning the first dielectric layer 26, and a first metal wire 27 is formed on the resulting structure with a predetermined width. A second dielectric layer 28, such as a $SiO_2$/SOG (spin-on-glass)/$SiO_2$ structure, is formed on the resulting structure. Thereafter, the second dielectric layer 28 is patterned to expose a portion of the first metal wire 27 through a via hole 29. After forming a second metal layer on the resulting structure and a dielectric layer on the second metal layer, the dielectric layer is patterned. The patterned dielectric layer is positioned at the via hole 29, thereby forming a dielectric pattern 31. The second metal wire 30 is formed by patterning the second metal layer using the dielectric pattern 31 as an etching mask.

Figure 6A:
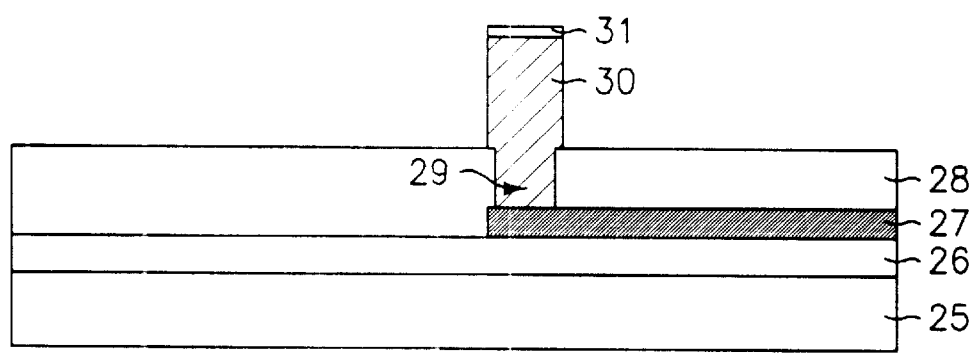
FIGS. 6A, 6B, 6C, 6D, and 6E are cross-sectional views illustrating a method for fabricating the spiral inductor according to a third embodiment of the present invention.
Figure 6B:
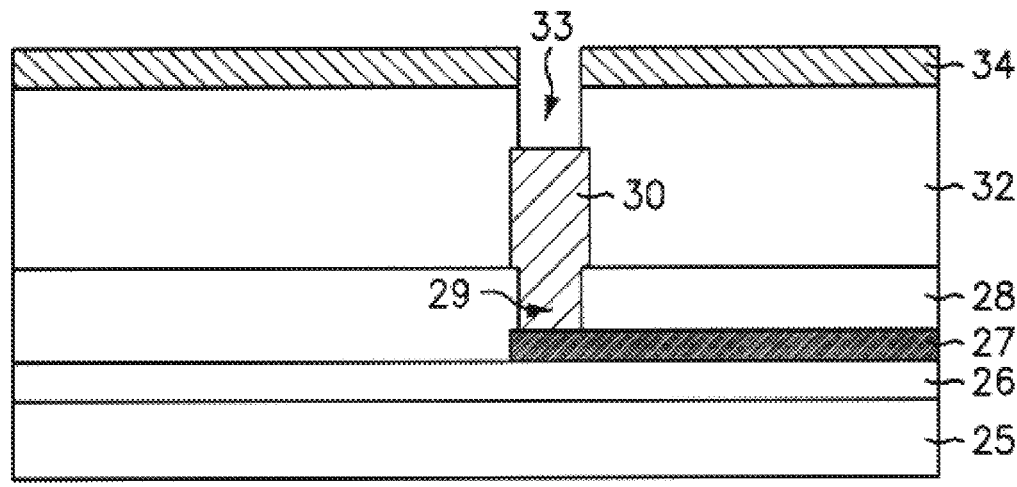

Referring to FIG. 6B, a third dielectric layer 32, such as a $SiO_2$/SOG/$SiO_2$ structure, is formed on the resulting structure and a photoresist layer is formed on the third dielectric layer 32. A photoresist pattern 34 is formed in order to provide a via hole 33 which expose the second metal wire 30. Using the photoresist pattern 34 as an etching mask, the third dielectric layer 32 is etched so as to form the via hole 33.

Figure 6C:
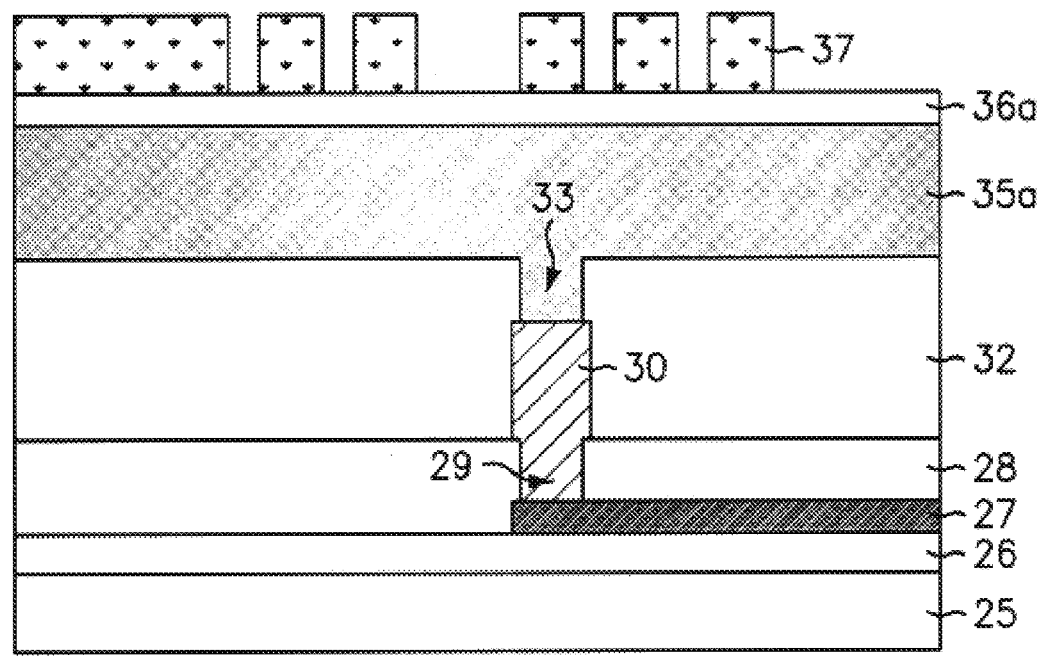

Referring now to FIG. 6C, the photoresist pattern 34 is removed and a metal layer 35a is formed on the resulting structure. After forming a fourth dielectric layer 36a on the metal layer 35a to provide a hard mask, a spiral photoresist pattern 37 is formed on the fourth dielectric layer 36a. Likewise, when the metal layer 35a is formed, a TiN layer is first deposited as a barrier metal and an aluminum layer thicker than the depth of the via hole is deposited with the reflow process, thereby filling the holes 33 with the Al layer. Since such a thick and uniform inductor may be formed, the parasitic resistance may be reduced. Further, since the inductor is formed by the third metal layer which is spaced apart from the silicon substrate and the parasitic resistance is decreased, the high quality factor Q and high-performance spiral inductor having a large resonant frequency $f_{wo}$ may be obtained in this embodiment. It is possible to integrate the digital ICs, analogue ICs and RF ICs on one chip, provided that the high performance inductor according to the present invention is obtained.

Figure 6D:
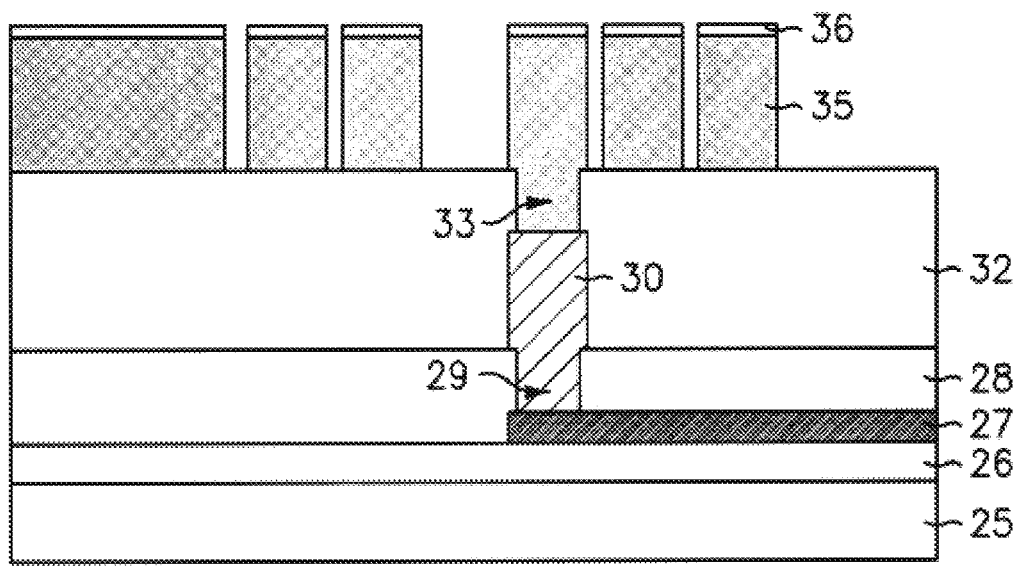

Referring to FIG. 6D, after forming a dielectric pattern 36 having a spiral shape by etching the fourth dielectric layer 36a using the photoresist pattern 37 as an etching mask, a third metal wire 35 is formed by patterning the metal layer 35a using the dielectric pattern 36.

Figure 6E:
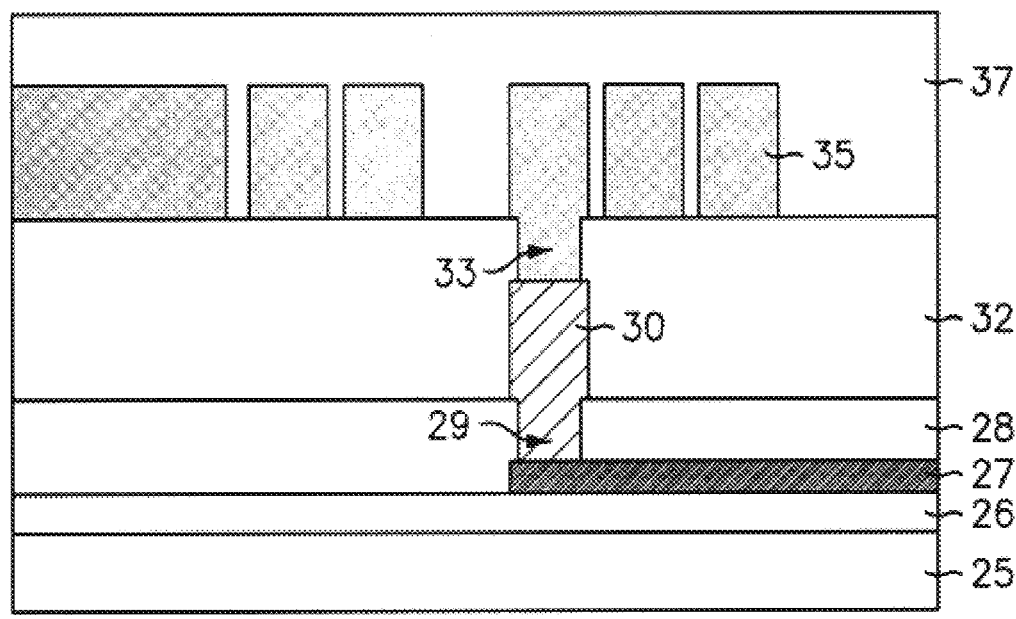

As shown in FIG. 6E, the inductor fabricating processes have been completed by forming a passivation layer 37 on the resulting structure.

Figure 7A:
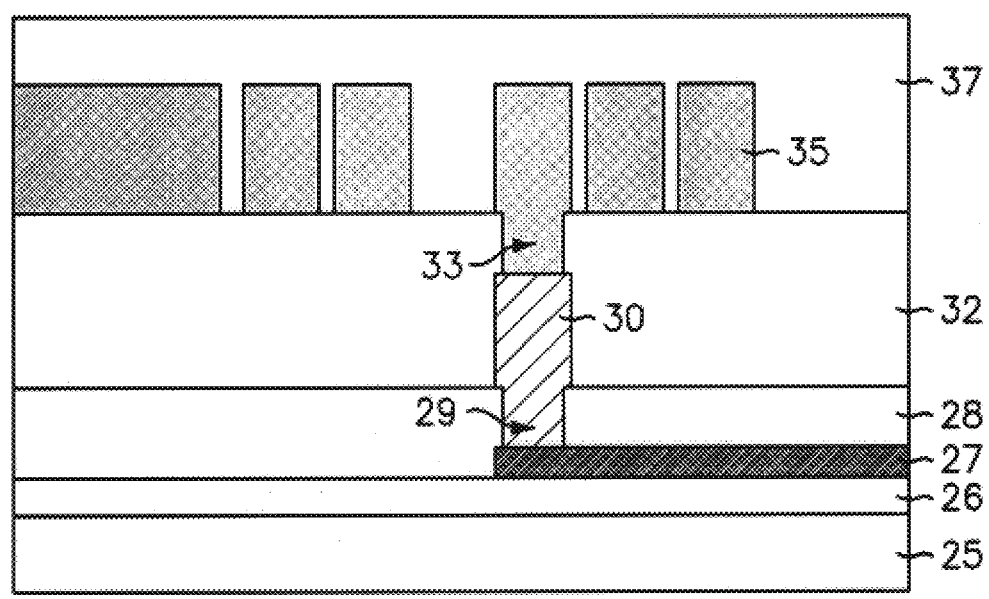
FIG. 7A is a cross-sectional view of the spiral inductor according to the third embodiment of the present invention.
Figure 7B:
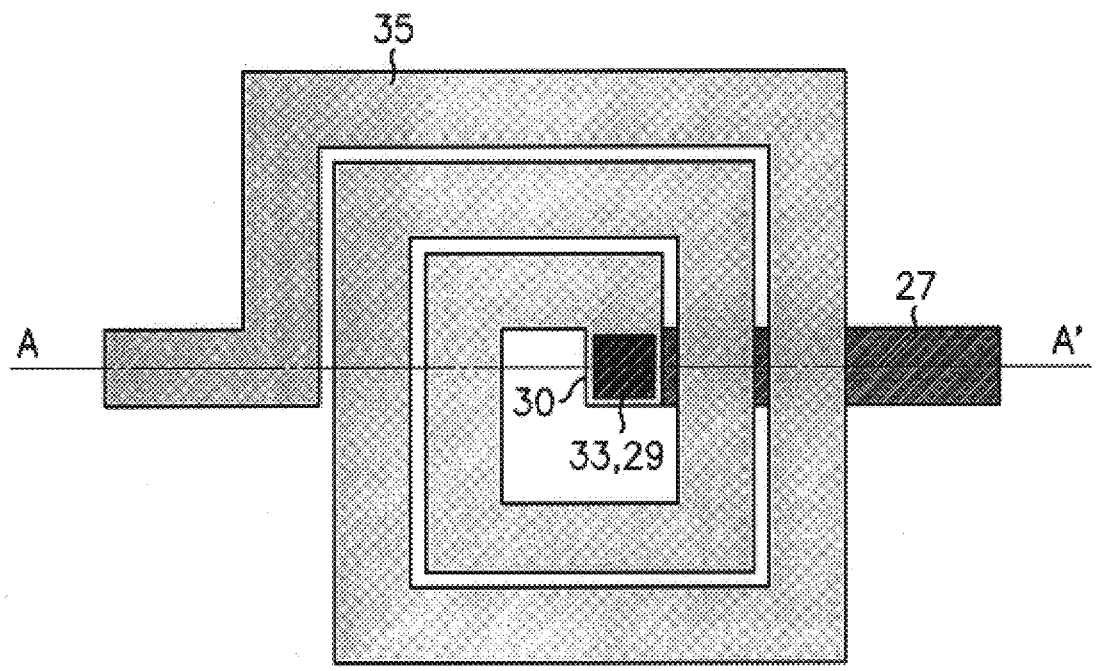
FIG. 7B is a layout of the spiral inductor in FIG. 7A.

FIG. 7A is a cross-sectional view of the spiral inductor according to the third embodiment of the present invention and FIG. 7B is a layout of the spiral inductor in FIG. 7A. Referring to FIGS. 7A and 7B, in the inductor according to the third embodiment of the present invention, the second metal wire 30 is positioned only at the via hole 29. Also, since the third metal wire 35, which is in contact with the second metal wire 30, is used as an inductor, the third metal wire 35 is spaced apart from the silicon substrate 25 so that the parasitic capacitance is reduced.

Figure 8:
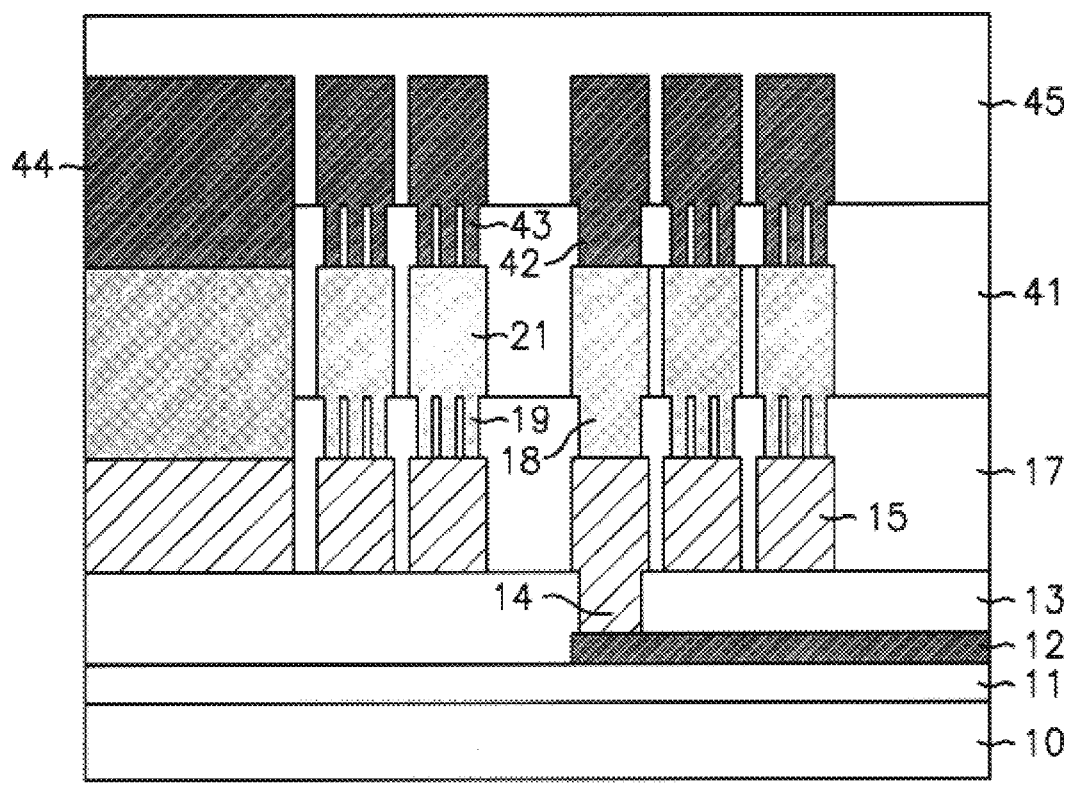
FIG. 8 is a cross-sectional view illustrating a spiral inductor according to a fourth embodiment of the present invention.

FIG. 8 is a cross-sectional views illustrating a spiral inductor according to a fourth embodiment of the present invention. In the fourth embodiment, the fourth metal layer is used as an spiral inductor coil. A fourth dielectric layer 41 is deposited on the resulting structure in which the third metal wire 21 is formed with the structures illustrated in FIGS. 4A to 4D. After forming a via hole 42 and via recesses 43 exposing the third metal wire 21 by patterning the fourth dielectric layer 41 in a photolithography manner, a spiral metal wire 44 is formed with a passivation layer 45.

Figure 9:
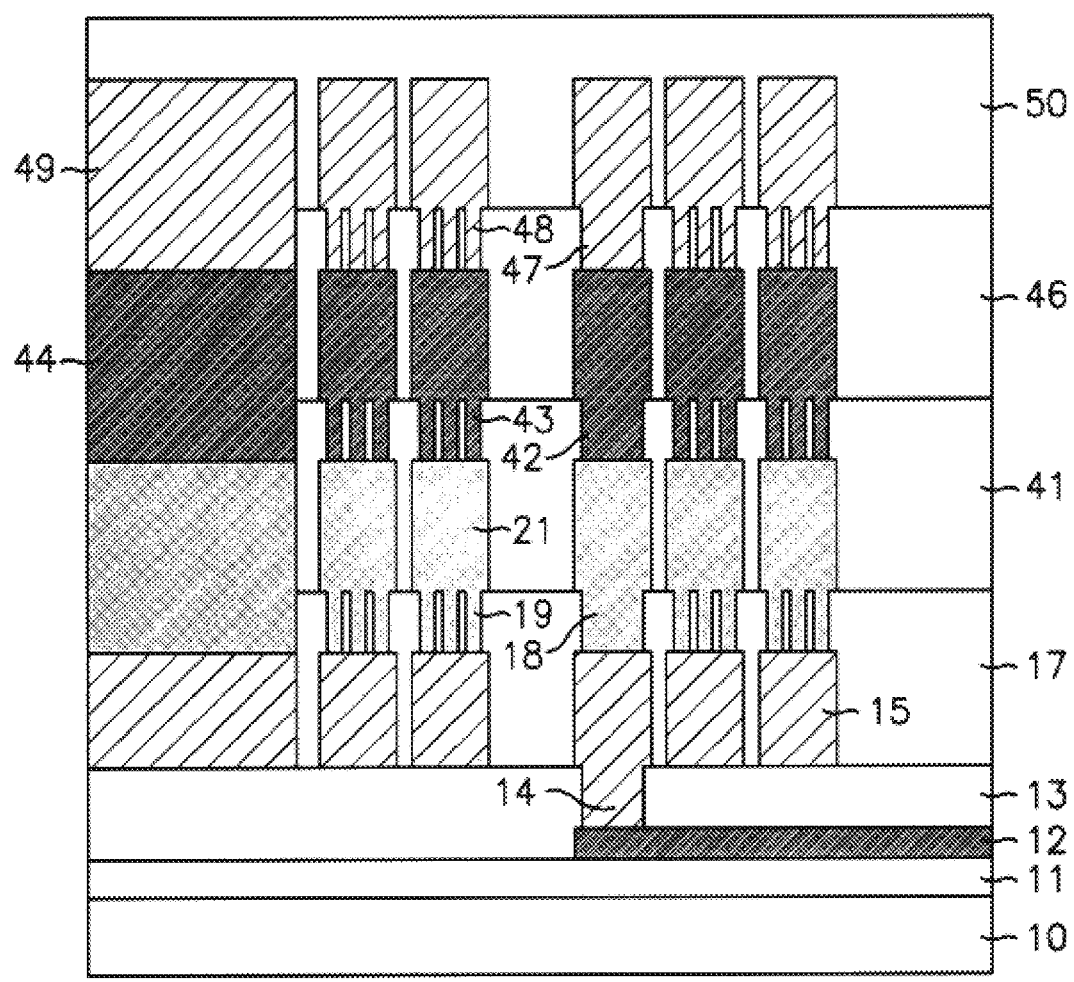
FIG. 9 is a cross-sectional view illustrating a spiral inductor according to a fifth embodiment of the present invention.

FIG. 9 is a cross-sectional views illustrating a spiral inductor according to a fifth embodiment of the present invention. The fifth metal layer is formed as an inductor coil. After forming the spiral metal wire 44 of FIG. 8, a fifth dielectric layer 46 is deposited and patterned so that a via hole 47 and via recesses 48 are formed to expose the spiral metal wire 44. As a result, a fifth metal layer is formed and a fifth metal wire 49 is formed with a passivation layer 50.

Figure 10:
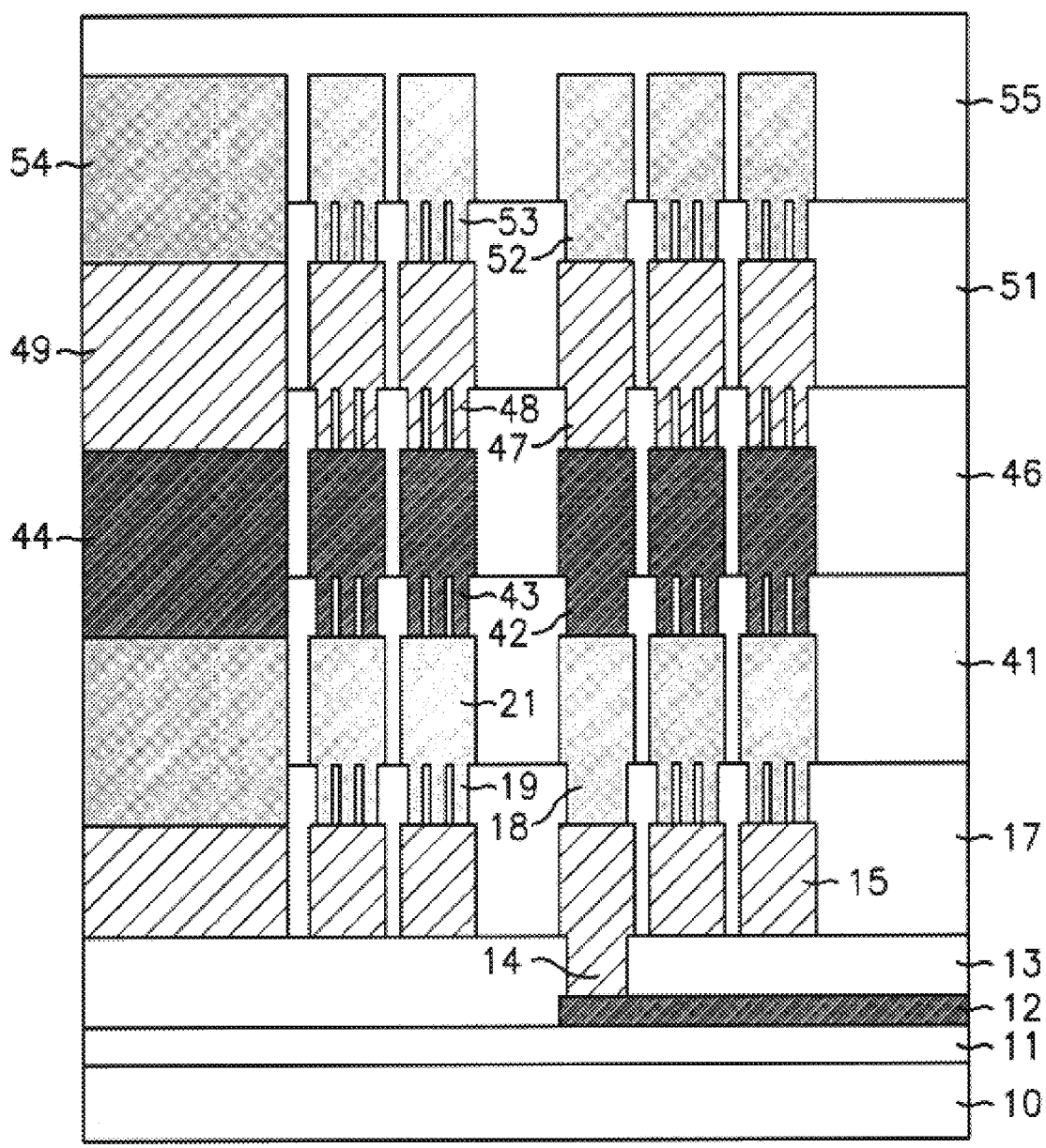
FIG. 10 is a cross-sectional view illustrating a spiral inductor according to a sixth embodiment of the present invention.

FIG. 10 is a cross-sectional views illustrating a spiral inductor according to a sixth embodiment of the present invention. The sixth embodiment forms a sixth metal layer 51 as an inductor. That is, after forming the fifth metal wire 49 in FIG. 9, a sixth dielectric layer 51 is formed to cover the fifth metal wire 49 with a via hole 52 and via recesses 53. A spiral sixth metal wire 54 is coated with the passivation layer 55.

Figure 11:
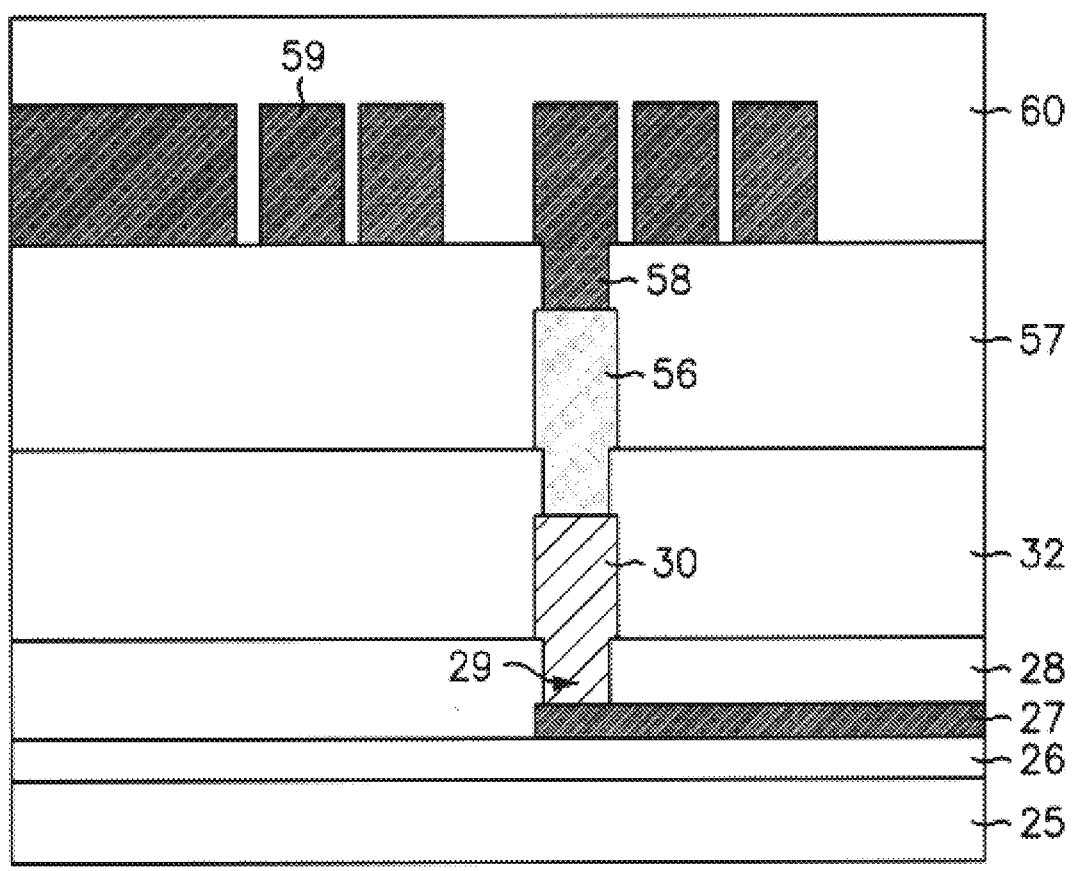
FIG. 11 is a cross-sectional view illustrating a spiral inductor according to a seventh embodiment of the present invention.

FIG. 11 is a cross-sectional views illustrating a spiral inductor according to a seventh embodiment of the present invention. The inductor fabricating method according to the present invention uses the fourth metal layer as an inductor coil. First, as shown in FIGS. 6A and 6B, the third dielectric layer 32 is formed with the second metal wire 30 and the via hole 33, a third metal layer is formed on the resulting structure. After forming a third metal wire 56 (corresponding to the reference numeral 35 of FIG. 6D) having a pole-shaped pattern, being in contact with the second metal wire, a fourth dielectric layer 57 is formed on the third metal wire 56. A via hole 58 exposing the third metal wire 56 is formed by patterning the fourth dielectric layer 57. A fourth metal wire 59 is formed as a spiral inductor and the passivation layer 60 is formed on the spiral inductor.

Figure 12:
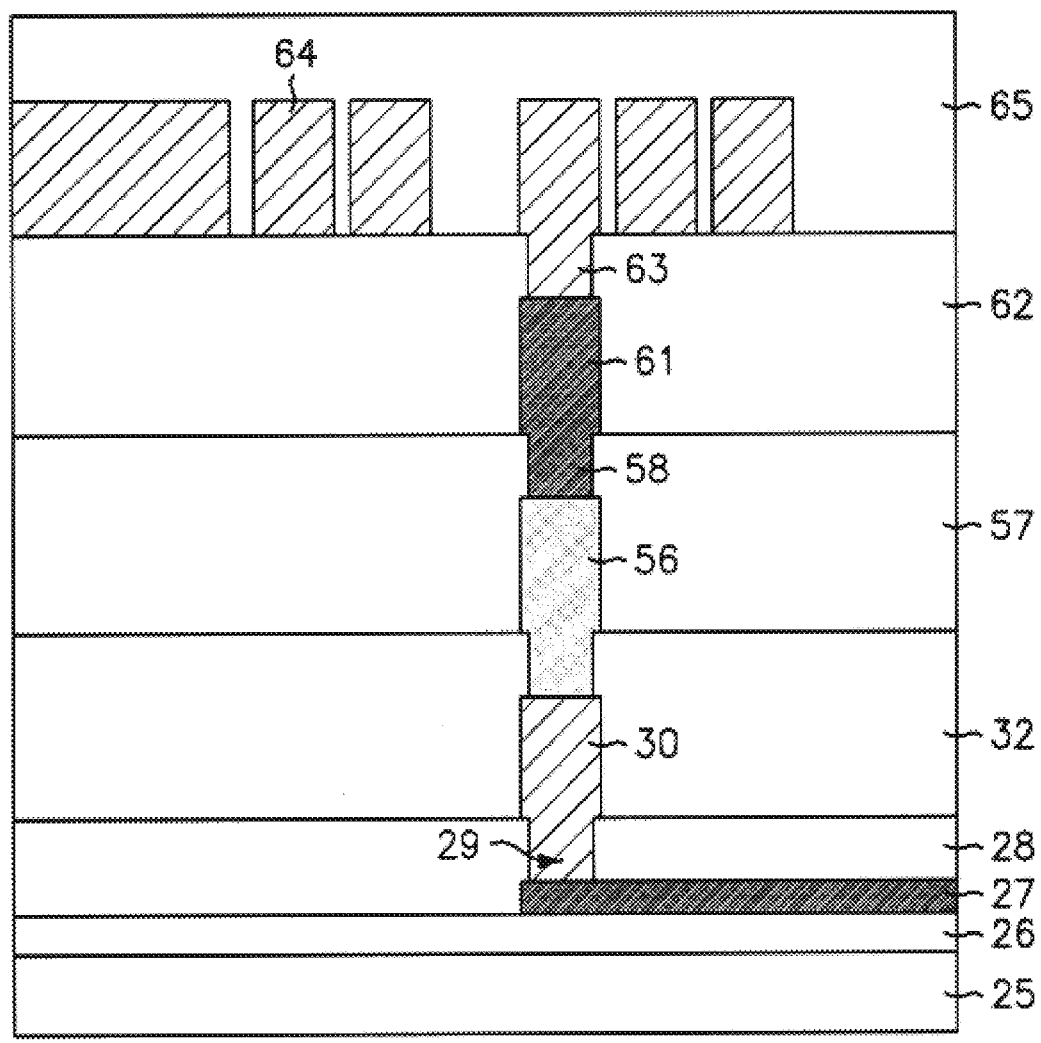
FIG. 12 is a cross-sectional view illustrating a spiral inductor according to an eight embodiment of the present invention.

FIG. 12 is a cross-sectional views illustrating a spiral inductor according to an eight embodiment of the present invention. The inductor fabricating method according to the present invention uses a fifth metal layer as an inductor coil. Compared with that shown in FIG. 11, the contact plug 63, an additional metal wire 64 and a passivation layer 65 are further formed.

Figure 13:
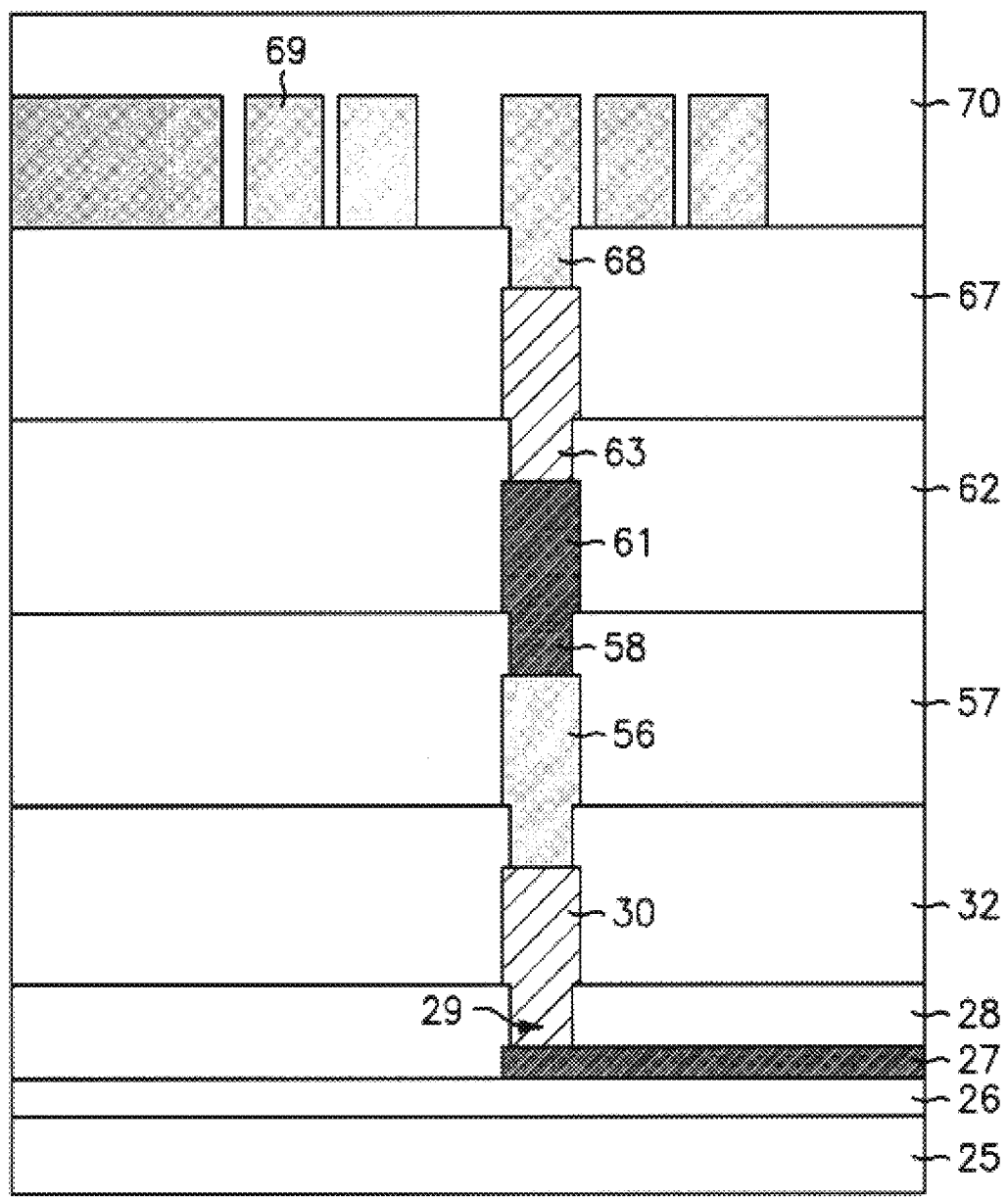
FIG. 13 is a cross-sectional view illustrating a spiral inductor according to a ninth embodiment of the present invention.

FIG. 13 is a cross-sectional views illustrating a spiral inductor according to a ninth embodiment of the present invention. The inductor fabricating method according to the present invention uses a sixth metal layer as an inductor coil. Compared with that shown in FIG. 12, the contact plug 68, an additional metal wire 69 and a passivation layer 70 are further formed.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating an inductor, comprising the steps of:

forming a first dielectric layer on a silicon substrate and forming a first metal wire on the first dielectric layer, wherein the first metal wire is in contact with an active element formed on the silicon substrate;

forming a second dielectric layer on the resulting structure and forming an opening exposing the first metal wire;

forming a second metal wire which is electrically connected with the first metal wire;

forming a spiral dielectric pattern on the second metal wire; and etching the second metal wire using the spiral dielectric pattern as an etching mask, thereby forming a spiral metal wire, whereby a metal corrosion is prevented by using the spiral dielectric pattern as the etching mask.

2. The method in accordance with claim 1, wherein the spiral dielectric pattern is one of a silicon oxide layer, a silicon nitride layer and a silicon oxide/silicon nitride layer.

3. The method in accordance with claim 1, wherein the second dielectric layer has a $SiO_2$/SOG(spin-on-glass)/$SiO_2$ structure.

4. The method in accordance with claim 1, wherein a selective etching ratio for the second metal wire to the spiral dielectric pattern is of over 10:1.

5. The method in accordance with claim 1, wherein the second metal wire comprises a TiN barrier metal layer and an Al metal layer.

6. The method in accordance with claim 5, wherein the method further comprises a step of reflowing the Al metal layer.

7. A method for fabricating an inductor, comprising the steps of:

forming a first dielectric layer on a silicon substrate and forming a first metal wire on the first dielectric layer, wherein the first metal wire is in contact with an active element formed on the silicon substrate;

forming a second dielectric layer on the resulting structure and forming a first opening and recesses exposing the first metal wire;

forming a second metal wire which is electrically connected with the first metal wire;

forming a first spiral dielectric pattern on the second metal wire;

etching the second metal wire using the first spiral dielectric pattern as an etching mask, thereby forming a first spiral metal wire;

forming a third dielectric layer on the resulting structure and patterning the third dielectric layer to expose the second metal wire through a second opening and recesses;

forming a third metal wire which is electrically connected with the second metal wire;

forming a second spiral dielectric pattern on the third metal wire; and etching the third metal wire using the second spiral dielectric pattern as an etching mask, thereby forming a second spiral metal wire.

8. The method in accordance with claim 7, wherein the method further comprises the steps of:

depositing a dielectric layer on the resulting structure; and forming a metal wire on the dielectric layer, being electrically connected with the lower metal wire.

9. The method in accordance with claim 7, wherein the first and second spiral dielectric patterns are one of a silicon oxide layer, a silicon nitride layer and a silicon oxide/silicon nitride layer.

10. The method in accordance with claim 7, wherein the method further comprises a step of reflowing the first to third metal wires.

11. A method for fabricating an inductor, comprising the steps of:

forming a first dielectric layer on a silicon substrate and forming a first metal wire on the first dielectric layer, wherein the first metal wire is in contact with an active element formed on the silicon substrate;

forming a second dielectric layer on the resulting structure and forming an opening exposing the first metal wire;

forming a second metal wire which is electrically connected with the first metal wire;

forming a first spiral dielectric pattern on the second metal wire;

etching the second metal wire using the first spiral dielectric pattern as an etching mask, thereby forming a first spiral metal wire;

forming a third dielectric layer on the resulting structure and patterning the third dielectric layer to expose the second metal wire through an opening;

forming a third metal wire which is electrically connected with the second metal wire;

forming a second spiral dielectric pattern on the third metal wire; and etching the third metal wire using the second spiral dielectric pattern as an etching mask, thereby forming a second spiral metal wire.

12. The method in accordance with claim 11, wherein the method further comprises a step of reflowing the Al metal layer.

13. The method in accordance with claim 11, wherein the first and second spiral dielectric patterns are one of a silicon oxide layer, a silicon nitride layer and a silicon oxide/silicon nitride layer.

14. A method for fabricating an inductor, comprising the steps of:

forming a first dielectric layer on a silicon substrate and forming a first metal wire on the first dielectric layer, wherein the first metal wire is in contact with an active element formed on the silicon substrate; and alternatively forming dielectric layers and metal layers, wherein the metal layers are electrically connected with an upper metal wire and a lower metal wire and wherein the metal layers are patterned using the dielectric layers as etching mask.

* * * * *